(12) United States Patent
Vali et al.

(10) Patent No.: US 10,388,384 B2
(45) Date of Patent: Aug. 20, 2019

(54) DETERMINING DATA STATES OF MEMORY CELLS

(71) Applicant: MICRON TECHNOLOGY, INC., Boise, ID (US)

(72) Inventors: Tommaso Vali, Sezze (IT); Luca De Santis, Avezzano (IT); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/043,259

(22) Filed: Jul. 24, 2018

(65) Prior Publication Data

US 2019/0066804 A1 Feb. 28, 2019

Related U.S. Application Data

(63) Continuation of application No. 15/692,154, filed on Aug. 31, 2017, now Pat. No. 10,062,441.

(51) Int. Cl.

| G11C 11/56 | (2006.01) |
|---|---|
| G11C 16/26 | (2006.01) |
| G06F 11/07 | (2006.01) |
| G11C 29/02 | (2006.01) |
| G11C 16/04 | (2006.01) |
| G11C 29/24 | (2006.01) |

(52) U.S. Cl.
CPC ............ *G11C 16/26* (2013.01); *G06F 11/073* (2013.01); *G11C 11/5642* (2013.01); *G11C 29/028* (2013.01); *G11C 16/0458* (2013.01); *G11C 16/0483* (2013.01); *G11C 29/021* (2013.01); *G11C 29/24* (2013.01)

(58) Field of Classification Search
CPC ............... G06F 11/073; G11C 11/5642; G11C 16/0458; G11C 16/0483; G11C 16/26; G11C 16/34; G11C 29/021; G11C 29/028; G11C 29/24
USPC ............ 365/189.05, 185.03, 185.21, 185.25, 365/185.24, 185.29
See application file for complete search history.

(56) References Cited

U.S. PATENT DOCUMENTS

| 7,787,307 B2 | 8/2010 | Sarin |
|---|---|---|
| 7,898,864 B2 | 3/2011 | Dong |
| 8,498,152 B2 | 7/2013 | Alrod et al. |
| 9,361,996 B2 | 6/2016 | Shen et al. |
| 10,062,441 B1 * | 8/2018 | Vali ..................... G11C 11/5642 |

(Continued)

*Primary Examiner* — Tan T. Nguyen
(74) *Attorney, Agent, or Firm* — Dicke, Billig & Czaja, PLLC

(57) ABSTRACT

Methods of operating a memory include determining a voltage level of a plurality of voltage levels at which a memory cell is deemed to first activate in response to applying the to a control gate of that memory cell for each memory cell of a plurality of memory cells, determining a plurality of voltage level distributions from numbers of memory cells of a first subset of memory cells deemed to first activate at each voltage level of the plurality of voltage levels, determining a transition between a pair of voltage level distributions for each adjacent pair of voltage level distributions, and assigning a respective data state to each memory cell of a second subset of memory cells responsive to the determined voltage level at which that memory cell is deemed to first activate and respective voltage levels of the transitions for each adjacent pair of voltage level distributions.

13 Claims, 15 Drawing Sheets

(56) References Cited

U.S. PATENT DOCUMENTS

| | | | |
|---|---|---|---|
| 2009/0231914 A1 | 9/2009 | Yu et al. | |
| 2010/0309726 A1* | 12/2010 | Yang | G11C 16/26 |
| | | | 365/185.21 |
| 2013/0024605 A1 | 1/2013 | Sharon et al. | |
| 2013/0163346 A1* | 6/2013 | Shen | G11C 16/0483 |
| | | | 365/185.24 |
| 2014/0269055 A1* | 9/2014 | Kurosawa | G11C 16/10 |
| | | | 365/185.03 |
| 2015/0098276 A1 | 4/2015 | Shen et al. | |
| 2016/0034349 A1* | 2/2016 | Choi | G11C 11/5642 |
| | | | 714/764 |
| 2017/0365307 A1* | 12/2017 | Jeon | G11C 11/5642 |

\* cited by examiner

| Comparator Outputs | | | | | | | | | | | | | | | Gray Code |
|---|---|---|---|---|---|---|---|---|---|---|---|---|---|---|---|
| C15 | C14 | C13 | C12 | C11 | C10 | C9 | C8 | C7 | C6 | C5 | C4 | C3 | C2 | C1 | |
| 0 | 0 | 0 | 0 | 0 | 0 | 0 | 0 | 0 | 0 | 0 | 0 | 0 | 0 | 0 | 1111 |
| 0 | 0 | 0 | 0 | 0 | 0 | 0 | 0 | 0 | 0 | 0 | 0 | 0 | 0 | 1 | 0111 |
| 0 | 0 | 0 | 0 | 0 | 0 | 0 | 0 | 0 | 0 | 0 | 0 | 0 | 1 | 1 | 0011 |
| 0 | 0 | 0 | 0 | 0 | 0 | 0 | 0 | 0 | 0 | 0 | 0 | 1 | 1 | 1 | 1011 |
| 0 | 0 | 0 | 0 | 0 | 0 | 0 | 0 | 0 | 0 | 0 | 1 | 1 | 1 | 1 | 1001 |
| 0 | 0 | 0 | 0 | 0 | 0 | 0 | 0 | 0 | 0 | 1 | 1 | 1 | 1 | 1 | 0001 |
| 0 | 0 | 0 | 0 | 0 | 0 | 0 | 0 | 0 | 1 | 1 | 1 | 1 | 1 | 1 | 0101 |
| 0 | 0 | 0 | 0 | 0 | 0 | 0 | 0 | 1 | 1 | 1 | 1 | 1 | 1 | 1 | 1101 |
| 0 | 0 | 0 | 0 | 0 | 0 | 0 | 1 | 1 | 1 | 1 | 1 | 1 | 1 | 1 | 1100 |
| 0 | 0 | 0 | 0 | 0 | 0 | 1 | 1 | 1 | 1 | 1 | 1 | 1 | 1 | 1 | 0100 |
| 0 | 0 | 0 | 0 | 0 | 1 | 1 | 1 | 1 | 1 | 1 | 1 | 1 | 1 | 1 | 0000 |
| 0 | 0 | 0 | 0 | 1 | 1 | 1 | 1 | 1 | 1 | 1 | 1 | 1 | 1 | 1 | 1000 |
| 0 | 0 | 0 | 1 | 1 | 1 | 1 | 1 | 1 | 1 | 1 | 1 | 1 | 1 | 1 | 1010 |
| 0 | 0 | 1 | 1 | 1 | 1 | 1 | 1 | 1 | 1 | 1 | 1 | 1 | 1 | 1 | 0010 |
| 0 | 1 | 1 | 1 | 1 | 1 | 1 | 1 | 1 | 1 | 1 | 1 | 1 | 1 | 1 | 0110 |
| 1 | 1 | 1 | 1 | 1 | 1 | 1 | 1 | 1 | 1 | 1 | 1 | 1 | 1 | 1 | 1110 |

FIG. 11

DETERMINING DATA STATES OF MEMORY CELLS

RELATED APPLICATIONS

This Application is a Continuation of U.S. patent application Ser. No. 15/692,154, titled "DETERMINING DATA STATES OF MEMORY CELLS," filed Aug. 31, 2017, now U.S. Pat. No. 10,062,441 issued on Aug. 28, 2018, which is commonly assigned and incorporated herein by reference.

TECHNICAL FIELD

The present disclosure relates generally to memory and, in particular, in one or more embodiments, the present disclosure relates to methods and apparatus for determining data states of memory cells.

BACKGROUND

Memory devices are typically provided as internal, semiconductor, integrated circuit devices in computers or other electronic devices. There are many different types of memory including random-access memory (RAM), static random access memory (SRAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). An MLC uses more than two Vt ranges, where each Vt range indicates a different data state. Multiple-level cells can take advantage of the analog nature of a traditional charge storage structure by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

Sensing (e.g., reading or verifying) a data state of a memory cell often involves detecting whether the memory cell is activated in response to a particular voltage applied to its control gate, such as by detecting whether a data line connected to the memory cell experiences a change in voltage level caused by current flow through the memory cell. As MLC advances to represent additional data states, the margins between adjacent Vt ranges can become smaller. This can lead to an inaccurate determination of the data state of a sensed memory cell if the Vt of the sensed memory cell shifts over time.

BRIEF DESCRIPTION OF THE DRAWINGS

FIG. 11 depicts a thermometric scale to Gray code decoding for use with various embodiments.

DETAILED DESCRIPTION

Figure 1:
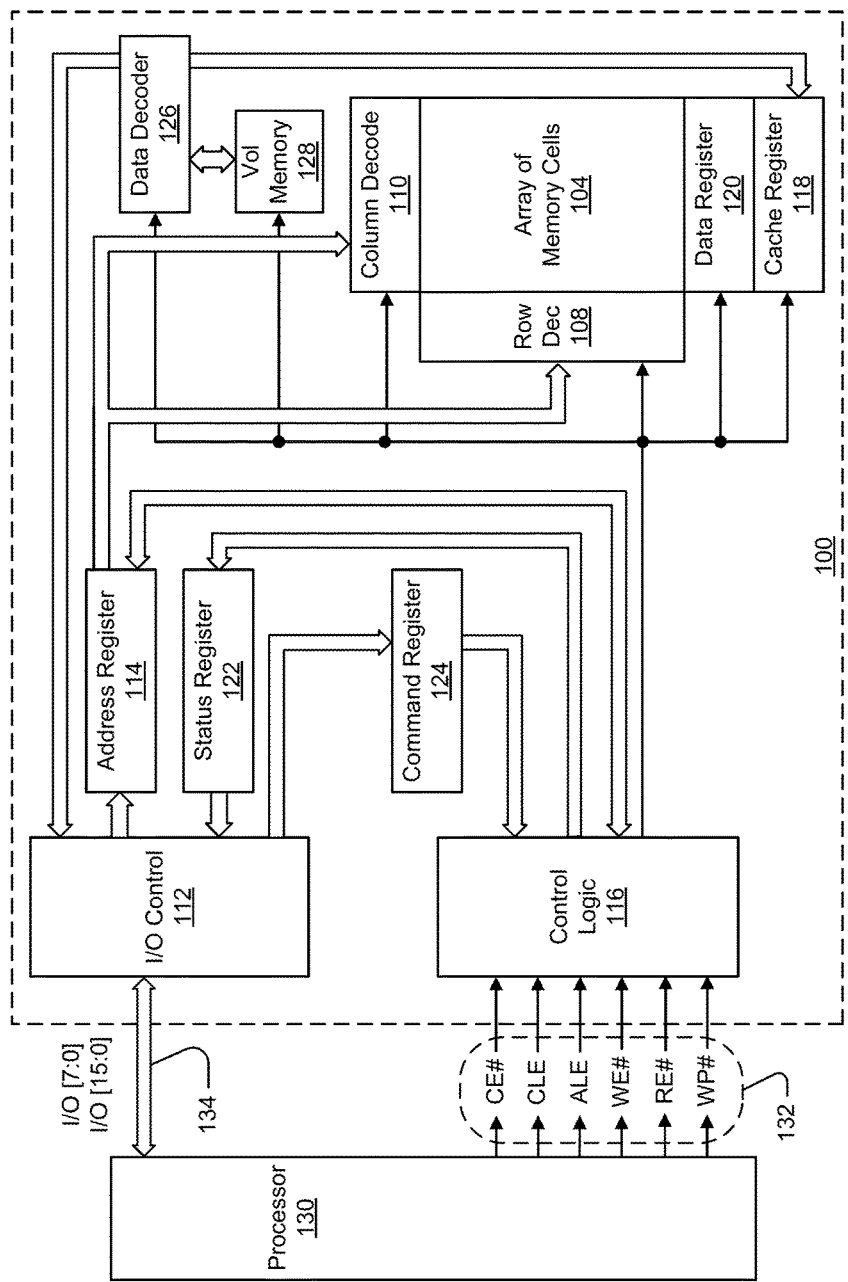
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, program operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Data decoder circuitry 126 may decode raw data values read from the array of memory cells 104 prior to output of that data. For example, the data decoder circuitry 126 might decode raw data having a number of digits of data that is greater than a number of digits of user data. That is, the raw data may contain hard data, e.g., representative of user data, and soft data, e.g., representative of additional information regarding that memory cell. The output of the data decoder circuitry 126 for a given memory cell might have a number of digits of data corresponding to the number of digits of user data. Although depicted in FIG. 1 to be between the cache register 118 and the I/O control circuitry 112, the data decoder circuitry 126 could be placed in other locations of the data path between the array of memory cells 104 and the I/O control circuitry 112. For example, the data decoder circuitry 126 might be part of the data register 120.

The data decoder 126 may be in communication with a volatile memory 128. Volatile memory 128 might include static random access memory (SRAM). The volatile memory 128 might contain information usable by the data decoder 126. The data decoder 126 and the volatile memory 128 may further be in communication with the control logic 116

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
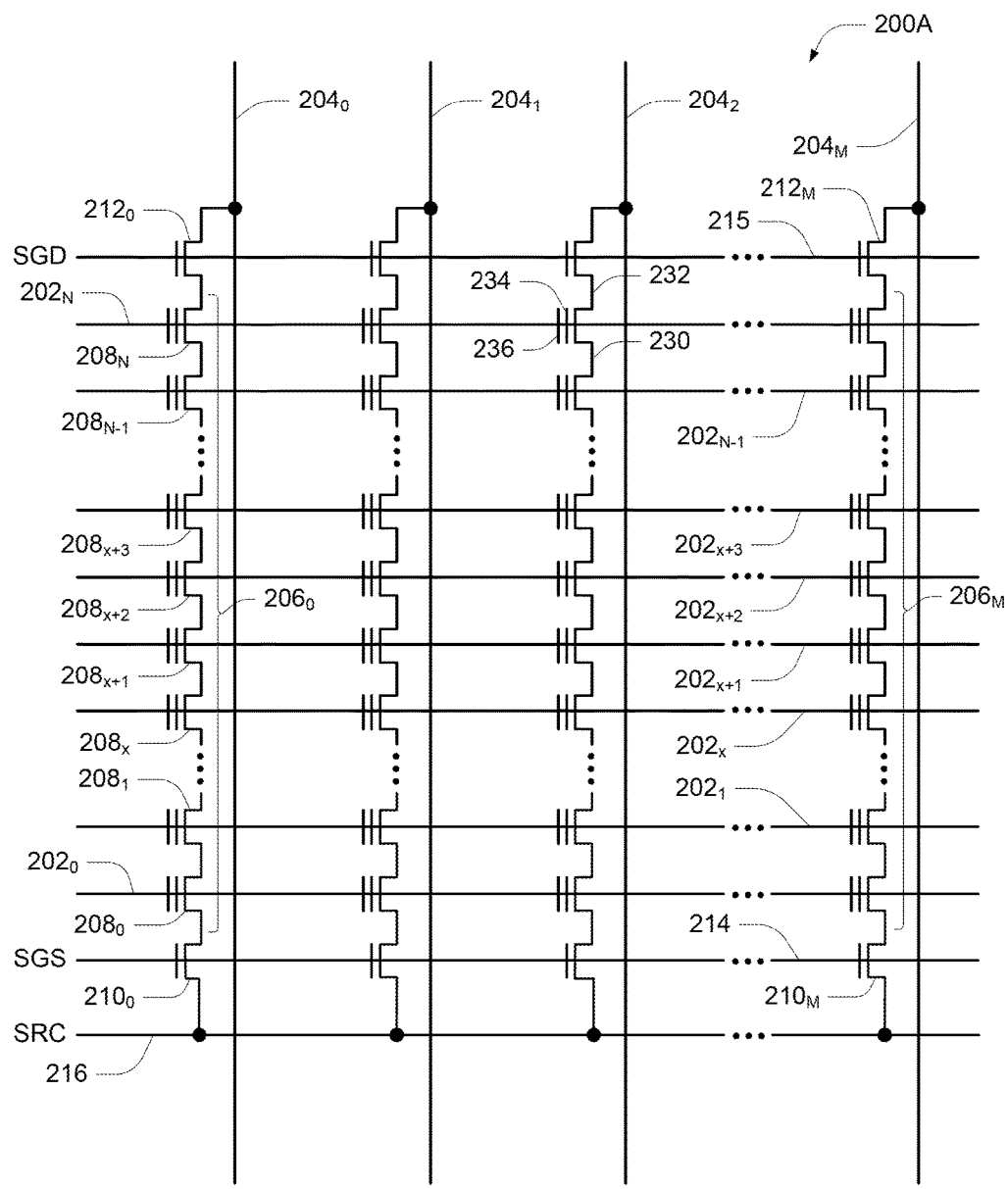
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Sensing the data state of a selected memory cell 208 of a NAND string 206 might include applying a number of stepped read voltages to a selected word line 202 while applying voltage levels to remaining word lines 202 coupled to the unselected memory cells 208 of the NAND 206 string sufficient to place the unselected memory cells in a conducting state independent of the Vt of the unselected memory cells. The bit line 204 corresponding to the selected memory cell 208 being read and/or verified may be sensed to determine whether or not the selected memory cell activates (e.g., conducts) in response to the particular read voltage level applied to the selected word line 202. For example, the data state of the selected memory cell 208, may be determined based on the current or voltage level of the bit line 204.

Figure 2B:
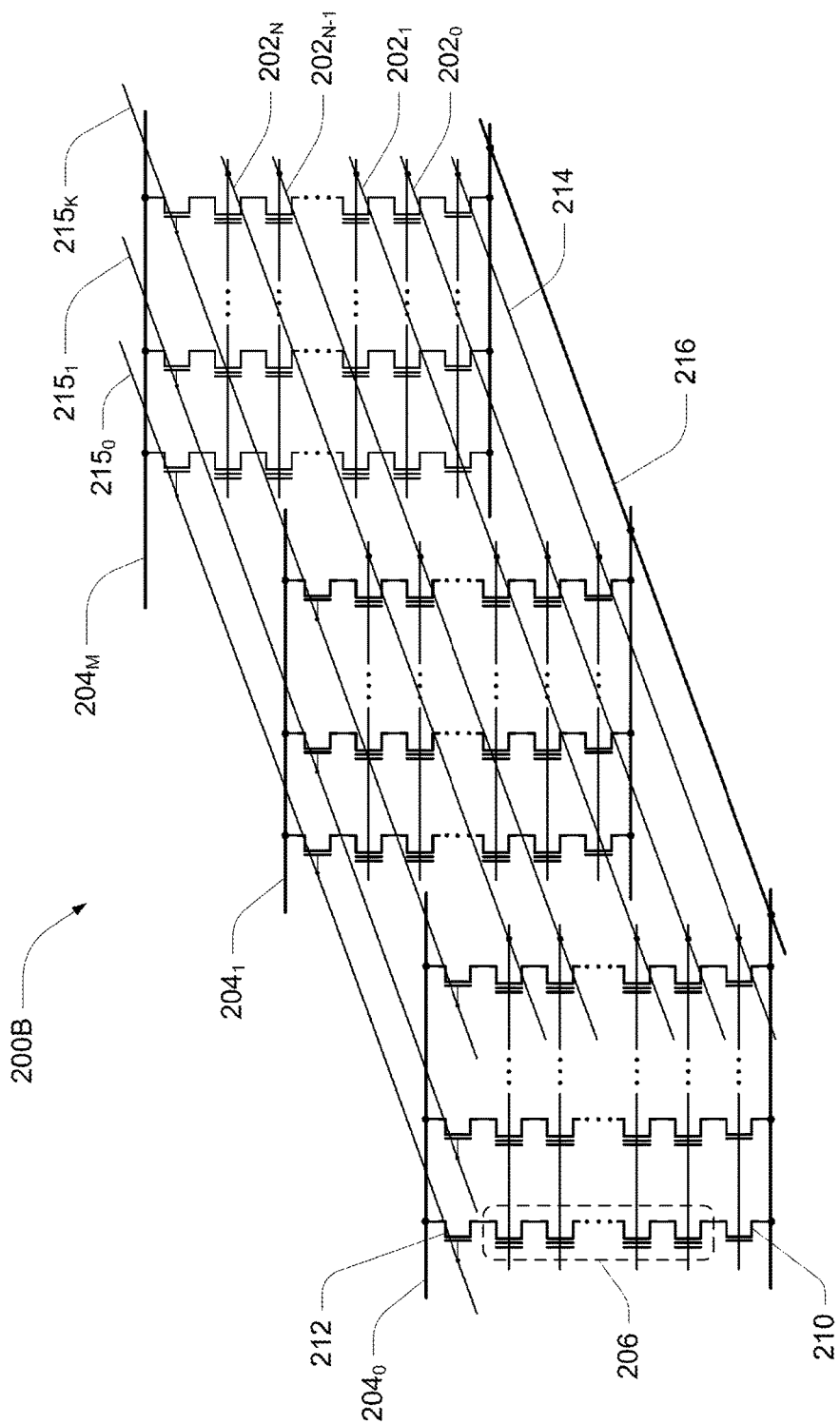

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3:
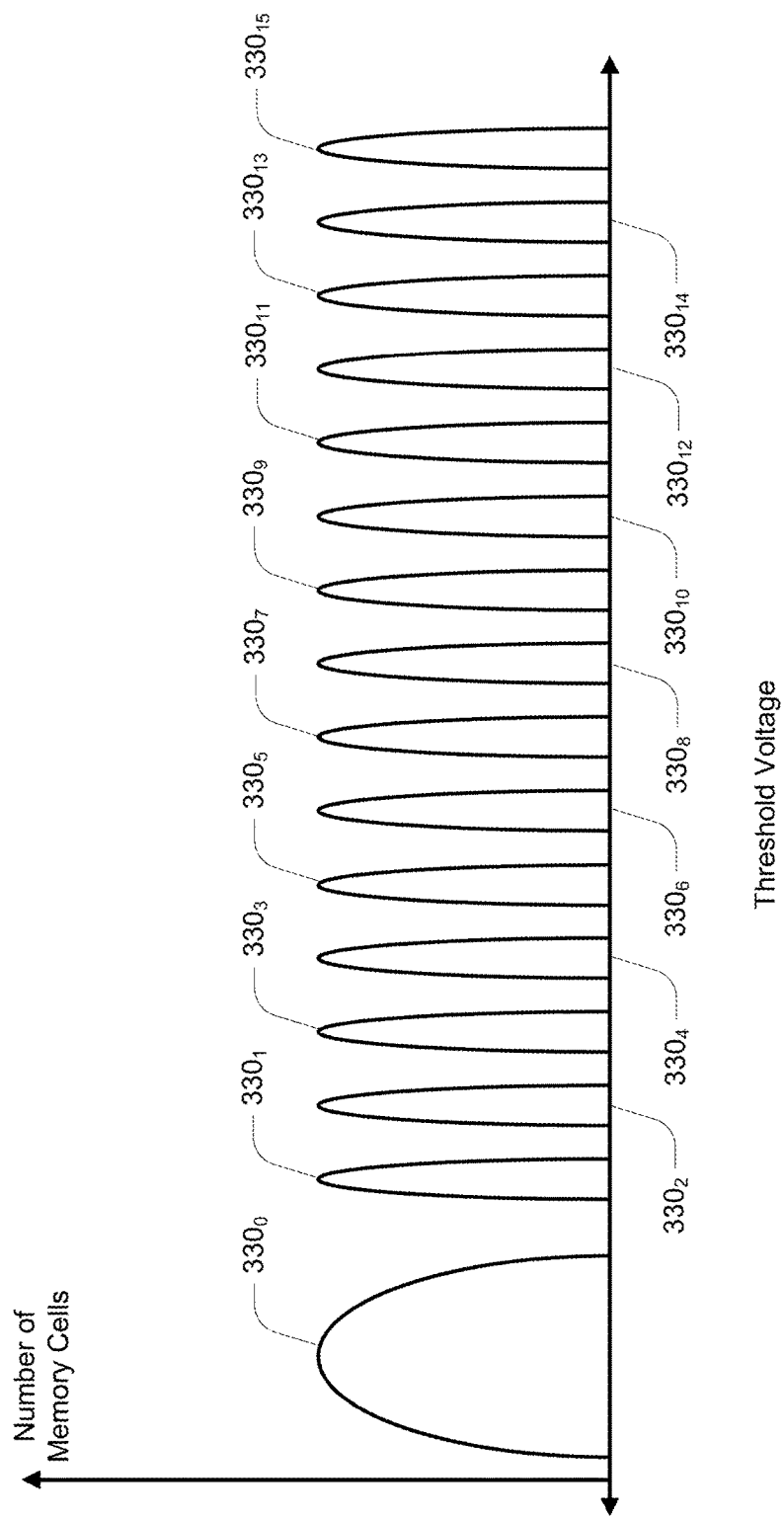
FIG. 3 is a conceptual depiction of threshold voltage distributions of a plurality of memory cells.

FIG. 3 is a conceptual depiction of threshold voltage ranges of a plurality of memory cells. FIG. 3 illustrates an example of threshold voltage ranges and their distributions for a population of a sixteen-level (e.g., four-bit) MLC memory cells, often referred to as QLC memory cells. For example, such a memory cell might be programmed to a threshold voltage (Vt) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ may tend to have tighter distributions.

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$ and $330_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case may be storing a data state L0 having a data value of logical '1111' and is typically referred to as the erased state of the memory cell. If the threshold voltage is within the second of the sixteen threshold voltage ranges $330_1$, the memory cell in this case may be storing a data state L1 having a data value of logical '0111'. If the threshold voltage is within the third of the eight threshold voltage ranges $330_2$, the memory cell in this case may be storing a data state L2 having a data value of logical '0011', and so on. Table 1 provides one possible correspondence between the data states and their corresponding logical data values.

TABLE 1

| Data State | Logical Data Value |
| --- | --- |
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Figure 4A:
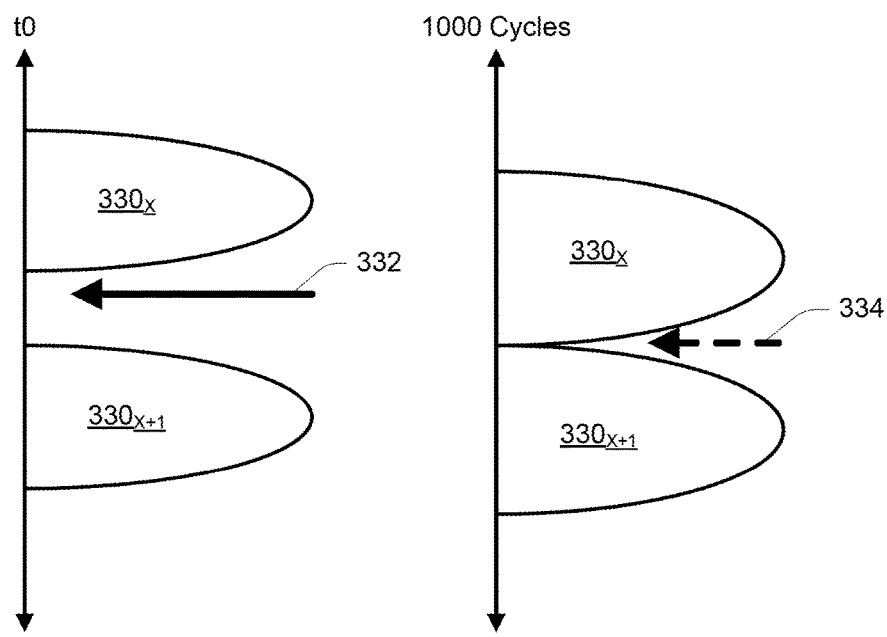
FIGS. 4A-4B are conceptual depictions of threshold voltage shifts.
Figure 4B:
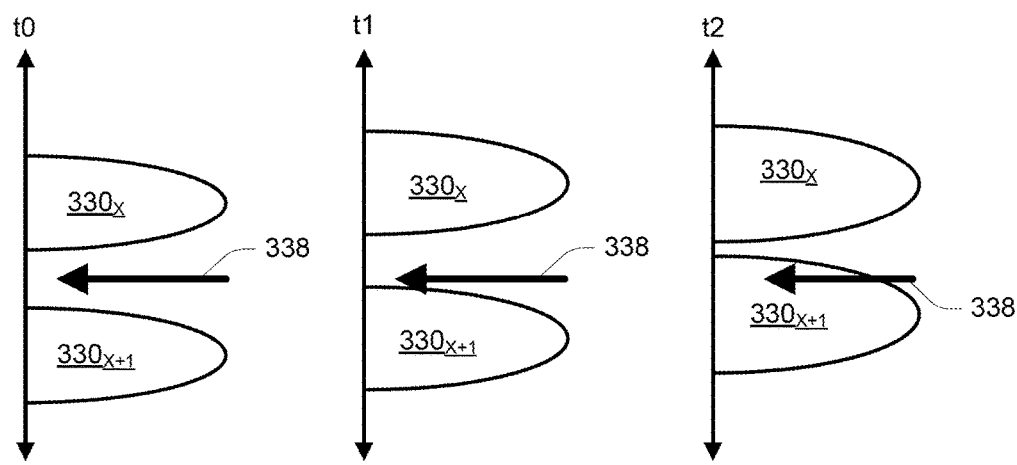

FIGS. 4A-4B are conceptual depictions of threshold voltage shifts. Threshold voltages of memory cells may shift due to read disturb and/or other phenomena, such as quick charge loss (QCL). In read disturb, the threshold voltage of a memory cell may shift in response to the voltage applied to the memory cell to facilitate access to the target memory cell selected for reading, e.g., increasing the threshold voltage of the memory cell. QCL is a de-trapping of electrons near a gate dielectric interface out to the channel region of the memory cell, and can cause an immediate Vt shift after a programming pulse. When a cell passes the verify operation, the programmed threshold voltage may appear to be higher due to the trapped charge in the gate dielectric. When the cell is read after the program operation has been completed, the cell may have a Vt that is lower than the Vt obtained during the program verify operation due to the charge in the gate dielectric leaking out to the channel region.

FIG. 4A is a conceptual depiction of threshold voltage shifting due to read disturb. Time t0 might represent the threshold voltage ranges $330_X$ and $330_{X+1}$ immediately after programming. The threshold voltage ranges $330_X$ and $330_{X+1}$ might represent any two adjacent threshold voltage ranges representing the data states to which the memory cells might be assigned, i.e., X could have any integer value 0-14 for the example of FIG. 3. Arrow 332 might represent a read voltage used to distinguish between these two data states, e.g., a memory cell first activating in response to the voltage level corresponding to the arrow 332 might be deemed to be within the threshold voltage range $330_X$. To compensate for read disturb over a number of read cycles, some memory devices store a subsequent value for a read voltage, represented by arrow 334, to be used after some number of read cycles, e.g., 1000 cycles in the example of FIG. 4A. Such adjustment of the read voltage might permit the memory to reduce errors that would be encountered if the original read voltage of arrow 332 were to be used, but limitations may arise by merely setting a voltage level of a subsequent read voltage. While the general direction of the threshold voltage shift may be predictable, its extent becomes less predictable.

FIG. 4B is a conceptual depiction of threshold voltage shifting due to QCL. Threshold voltage shifts may occur due to QCL regardless of the number of read cycles to which a memory cell has been subjected. The threshold voltage ranges $330_X$ and $330_{X+1}$ might represent any two adjacent threshold voltage ranges representing the data states to which the memory cells might be assigned. Time t0 might represent the threshold voltage ranges $330_X$ and $330_{X+1}$ immediately after programming, time t1 might represent the threshold voltage ranges $330_X$ and $330_{X+1}$ one second after programming, and time t2 might represent the threshold voltage ranges $330_X$ and $330_{X+1}$ one minute after programming. Arrow 338 might represent a read voltage used to distinguish between these two data states, e.g., a memory cell first activating in response to the voltage level corresponding to the arrow 338 might be deemed to be within the threshold voltage range $330_X$.

As can be seen in FIG. 4B, the threshold voltage ranges $330_X$ and $330_{X+1}$ may broaden and shift to lower threshold voltages at time t1, but the read voltage of the arrow 338 may still be used to distinguish between the two data states successfully. However, at time t2, the shift of the threshold voltage ranges $330_X$ and $330_{X+1}$ might become too severe, such that some memory cells in the threshold voltage range $330_{X+1}$ might be deemed to correspond to the data state corresponding to the threshold voltage range $330_X$ as the voltage level corresponding to the arrow 338 could activate some of the memory cells of the threshold voltage range $330_{X+1}$. Such competing phenomena, some raising threshold voltages and some lowering threshold voltages, may complicate the selection of an appropriate read voltage or read voltages used to distinguish data states over the life of the memory device. Various embodiments seek to determine data states of memory cells despite these variations in threshold voltage ranges.

Figure 5:
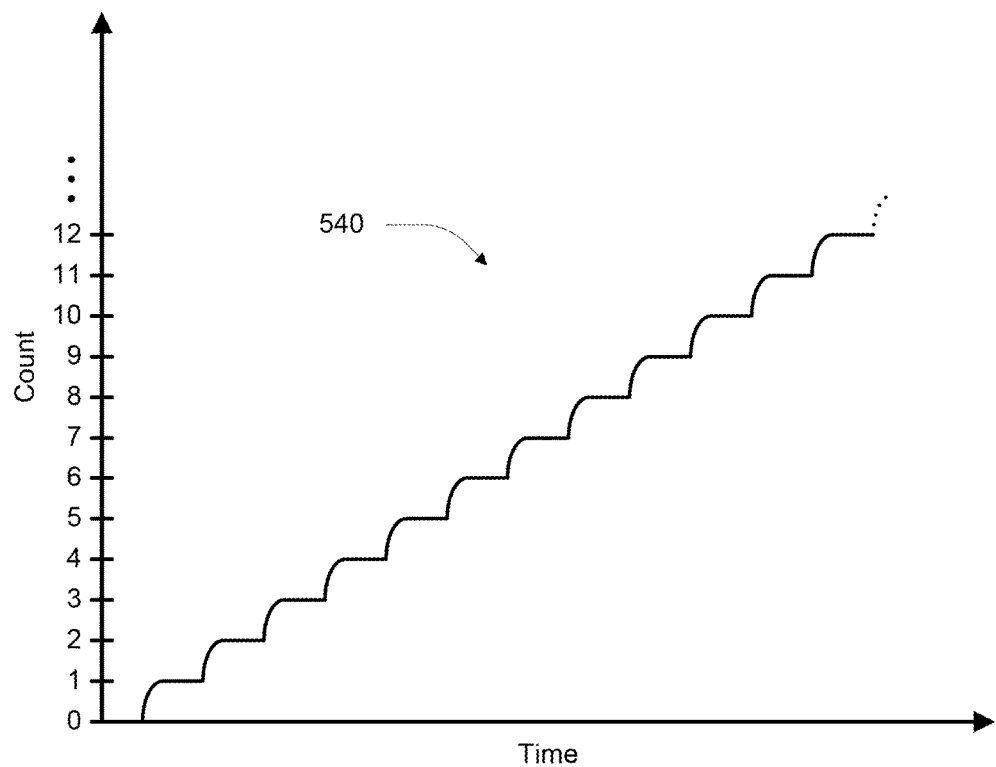
FIG. 5 is a depiction of a ramped read voltage for use with various embodiments.

FIG. 5 is a depiction of a ramped read voltage 540 for use with various embodiments. Various embodiments use a ramped voltage as the read voltage for the memory cells. The ramped (e.g., increasing) read voltage has a voltage level (e.g., changing voltage level) that is responsive to a count. For example, as values of the counts increase, the voltage level of the ramped read voltage increases in response. The ramped read voltage 540 may approximate, or more closely approximate, a linear response by increasing the number of counts used to generate a same ranges of read voltage levels.

Figure 6:
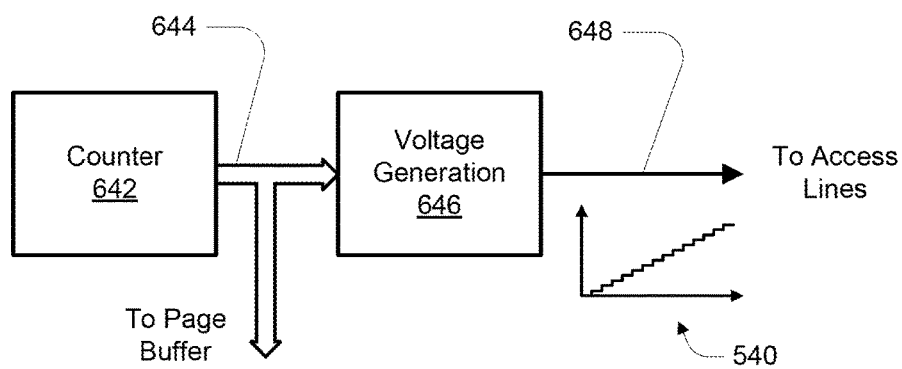
FIG. 6 is a block diagram of a voltage generation system for generating a ramped read voltage of the type depicted in FIG. 5 for use with various embodiments.

FIG. 6 is a block diagram of a voltage generation system for generating a ramped read voltage of the type depicted in FIG. 5 for use with various embodiments. The voltage generation system of FIG. 6 includes a counter 642 for producing a count. As an example, the counter 642 may have an output 644 for providing a bit pattern representative of the count. A voltage generation circuit 646, e.g., a digital-to-analog converter (DAC), might produce an analog voltage level responsive to the output 644 of the counter 642, e.g., the count. The DAC 646 might provide this voltage level at the output 648. The output 648 of the DAC 646 might be connected (e.g., selectively connected) to access lines of an array of memory cells. For example, the output 648 of the DAC 646 might be selectively connected to word lines 202 of FIGS. 2A-2B. The output 644 of the counter 642 might also be connected (e.g., selectively connected) to a page buffer of a memory, such as a portion of a data register 120 of FIG. 1.

Figure 7:
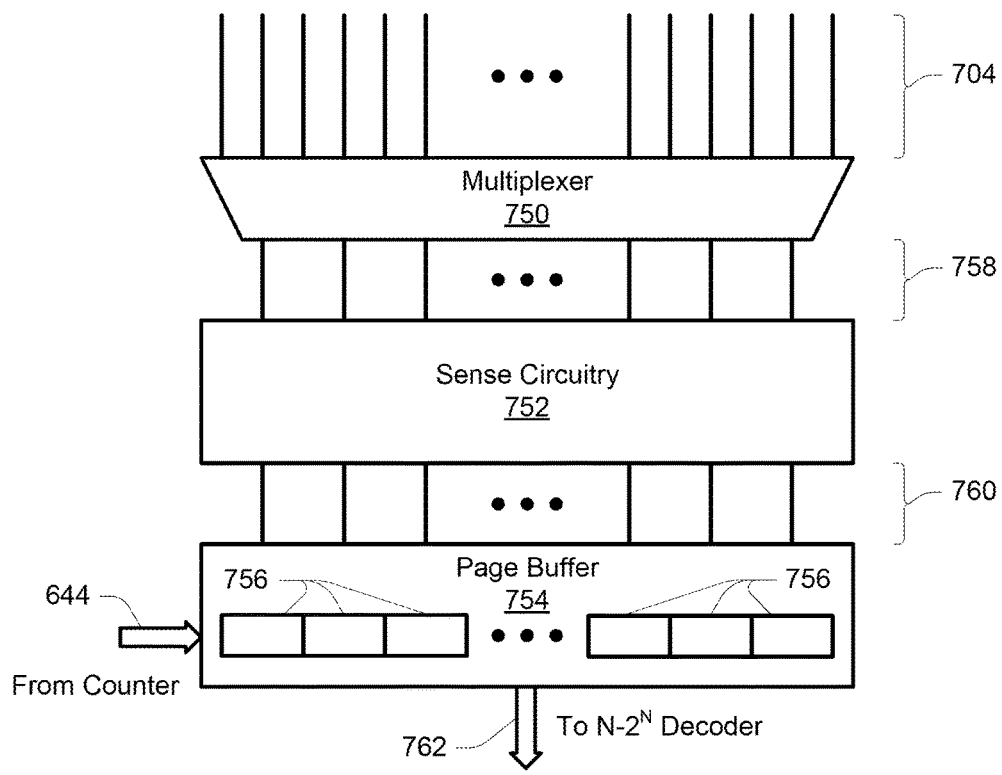
FIG. 7 is a block diagram of a portion of a data register for use with various embodiments.

FIG. 7 is a block diagram of a portion of a data register for use with various embodiments. The data register of FIG. 7 might represent a portion of the data register 120 of FIG. 1. The data register of FIG. 7 is connected to data lines 704 through a multiplexer 750. The data lines 704 might represent bit lines 204 of FIGS. 2A-2B. The multiplexer 750 may selectively connect a subset of the data lines 704 to sense circuitry 752 through inputs 758 of the sense circuitry 752. For example, where a logical page of memory cells includes every other data line, the multiplexer 750 might connect every other data line 704 (e.g., even or odd data lines 704) to the sense circuitry 752.

The sense circuitry 752 may include circuitry to sense a change in voltage or current, for example, of the connected data lines 704 during a read operation on a memory. The sense circuitry 752 may provide outputs 760 to a page buffer 754. The outputs 760 might indicate activation of a memory cell selected for a read operation through a transition in logic level. For example, the output 760 might have a logic 0 level at the beginning of the read operation, and may transition to a logic 1 level if its corresponding memory cell activates, thus changing a voltage level or initiating current flow through the corresponding data line 704. Each output 760 of the sense circuitry 752 may be in communication with a corresponding page buffer register 756 of the page buffer 754, e.g., in a one-to-one relationship.

The page buffer 754 is further connected to receive the count from the output 644 of the counter 642. In response to an output 760 of the sense circuitry 752 indicating activation of its corresponding memory cell, the page buffer 754 may store (e.g., latch) the value of the count into the corresponding page buffer register 756. The page buffer 754 may further be configured to store (e.g., latch) the last value of the count in corresponding page buffer registers 756 if their corresponding memory cells have not activated in response to any voltage level of the read voltage applied to their control gates, e.g., at the end of the read operation. The page buffer 754 may have an output 762 for outputting (e.g., streaming) values of its page buffer registers 756, e.g., raw data values.

Figure 8:
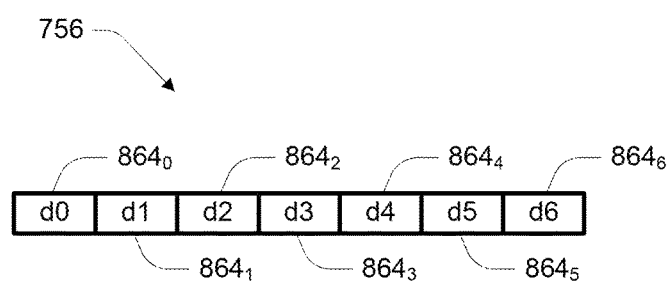
FIG. 8 is a block diagram of a page buffer register for use with various embodiments.

FIG. 8 is a block diagram of a page buffer register 756 for use with various embodiments. In the example of FIG. 8, the page buffer register 756 may contain a number of data registers 864 corresponding to a number of digits of the bit pattern of the count from the counter 642. The following description will assume a count represented by a seven-digit bit pattern to facilitate representing counts from 0 to 127. As such, for this example, each page buffer register 756 might include seven data registers 864, e.g., data registers $864_0$-$864_6$.

Figure 9A:
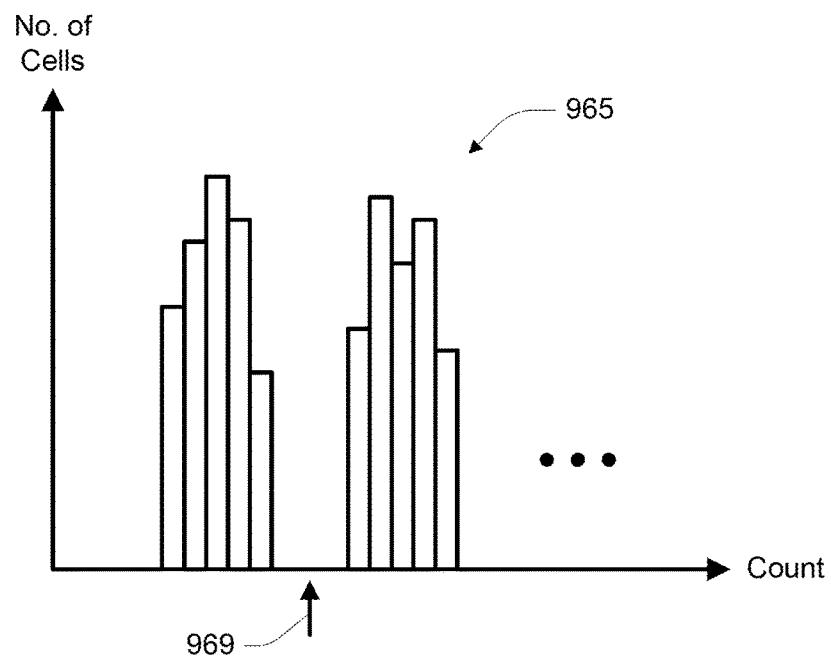
FIGS. 9A-9B are conceptual depictions of determining transitions between adjacent data states.
Figure 9B:
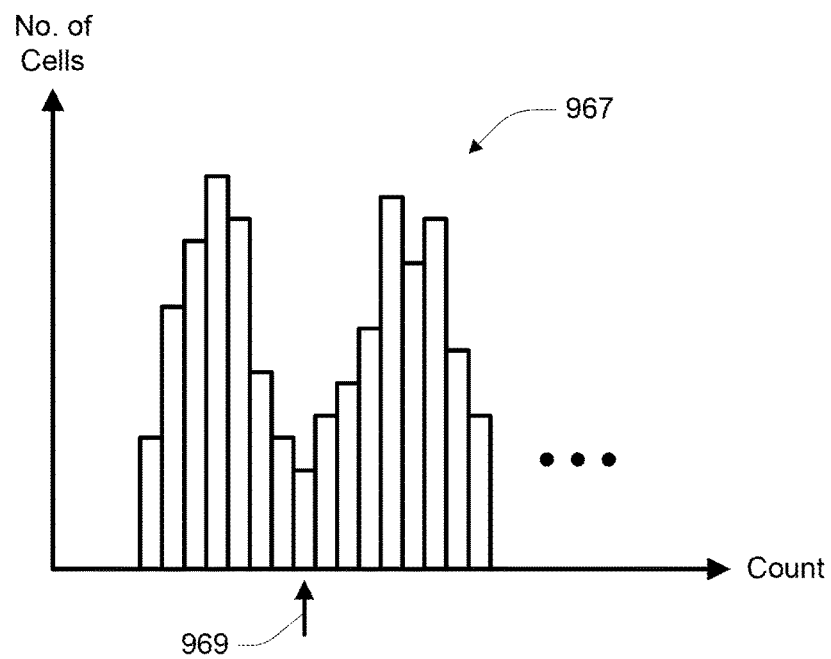

FIGS. 9A-9B are conceptual depictions of determining transitions between adjacent data states. As the ramped read voltage is applied to the access line of a logical page of memory cells selected for reading, different memory cells may activate at different voltage levels, i.e., they may activate in response to voltage levels responsive to different counts. The number of memory cells activating at each different voltage level and/or count might be represented by histograms 965 and 967, such as depicted in FIGS. 9A and 9B, respectively.

In FIG. 9A, there are shown two distinct groupings of memory cells. This might represent an ideal type of situation, e.g., shortly after performing a programming operation, where memory cells of different data states are sufficiently different in threshold voltage that there is a dead space between their two threshold voltage distributions. In such a situation, a valley 969 indicative of a transition between data states might be deemed to occur at a midpoint of the dead space. In FIG. 9B, the groupings of memory cells are shown to merge. This might occur due to voltage shifts as discussed with reference to FIGS. 4A and 4B. In such a situation, a valley 969 indicative of a transition between data states might be deemed to occur at local minima of the distributions.

Figure 10A:
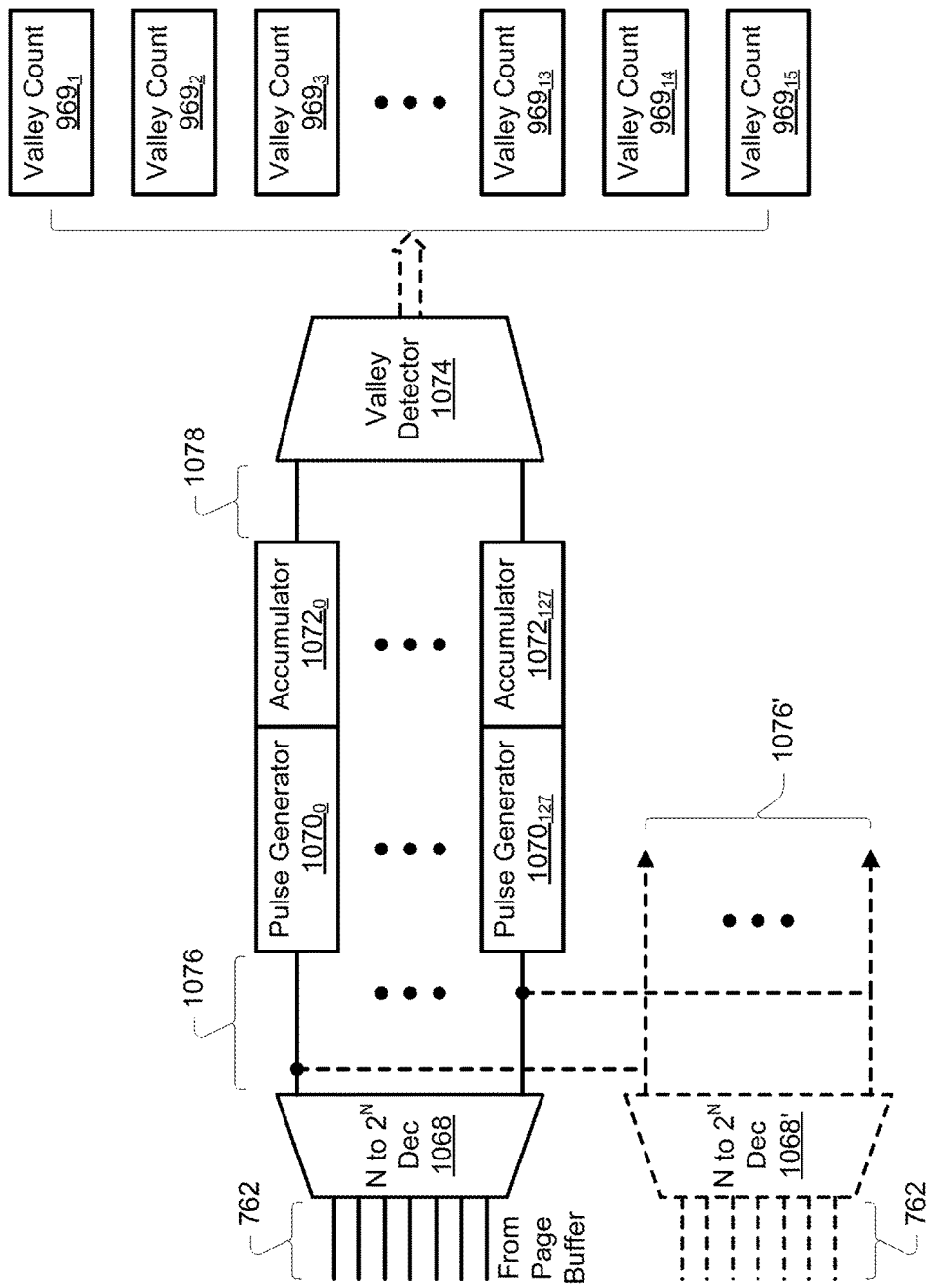
FIGS. 10A-10C are block diagrams of data decoder circuitry in accordance with various embodiments.
Figure 10B:
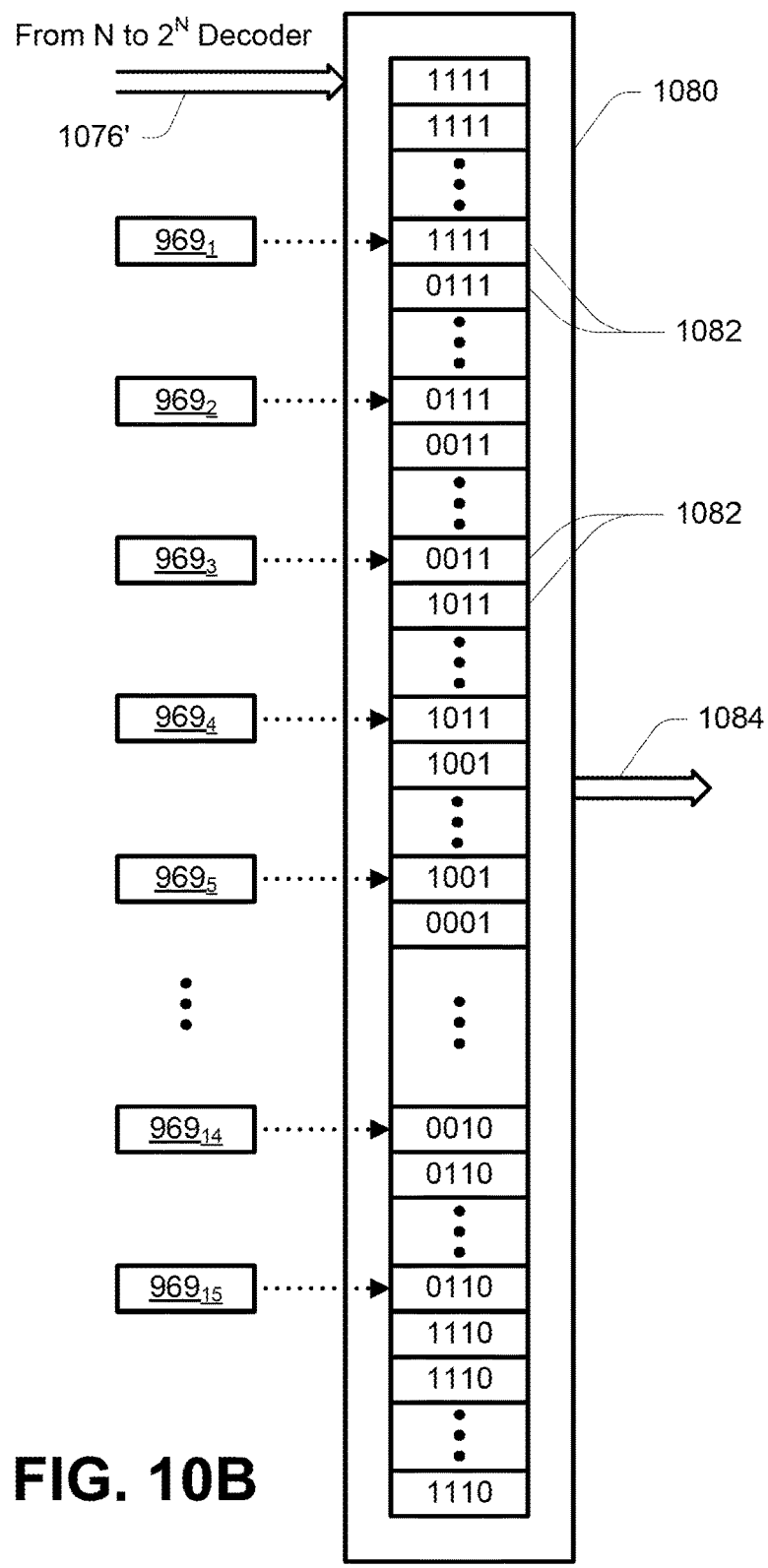
Figure 10C:
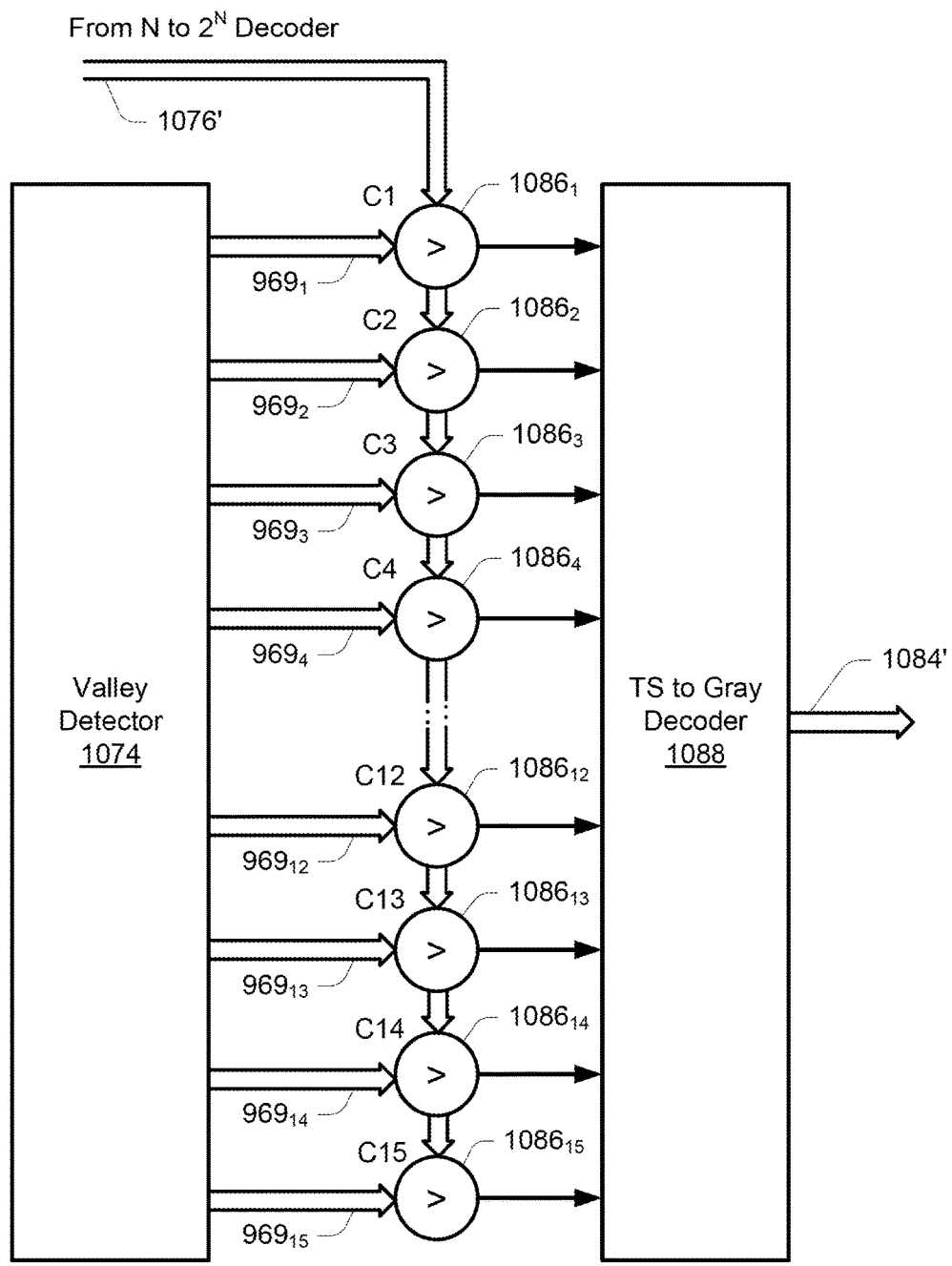

FIGS. 10A-10C are block diagrams of data decoder circuitry in accordance with various embodiments. As depicted in FIG. 10A, an N to $2^N$ decoder 1068 might receive the output 762 of the page buffer 754. For this example, the output 762 includes N digits of data, e.g., seven digits of data, one for each data register 864 of a page buffer register 756. The decoder 1068 includes $2^N$, e.g., 128 in this example, outputs 1076, where one output 1076 has a first logic level, e.g., a logic 1 level, and remaining outputs 1076 have a second logic level different than the first logic level, e.g., a logic 0 level. Each output 1076 is connected to a respective pulse generator 1070 and accumulator 1072, e.g., pulse generators $1070_0$-$1070_{127}$ and accumulators $1072_0$-$1072_{127}$. The outputs 1076 of the N to $2^N$ decoder 1068 might be further provided as outputs 1076' to other circuitry as discussed with reference to FIGS. 10B and 10C. Alternatively, a second N to $2^N$ decoder 1068' might be added to provide the outputs 1076'. The second N to $2^N$ decoder 1068' and its outputs 1076' might have the same configuration and response as the N to $2^N$ decoder 1068 and its outputs 1076.

The pulse generators 1070 may each generate a pulse in response to each transition of their respective output 1076 to the first logic level, and accumulators 1072 may each count and store a cumulative number of such pulses from their respective pulse generator 1070. The stored cumulative number of pulses may be output 1078 to a valley detector 1074. Each output 1078 corresponds to a respective count, thus representing a number of memory cells (e.g., of a sample) that activated in response to the voltage level of the read voltage responsive to that count. The data of a particular subset of the page buffer registers 756 might be utilized to generate the cumulative numbers of pulses, corresponding to a subset of a logical page of memory cells selected for the read operation. The sampled subset might be less than all of the page buffer registers 756 corresponding to the logical page of memory cells, e.g., a sample of 512 bytes of a 4,096 byte page size.

The valley detector 1074 may analyze the respective numbers of memory cells for each count and locate a number of valleys in the collective distributions, with each valley corresponding to a respective count, hereinafter referred to as valley counts 969. Each valley count 969 represents a transition between adjacent data states of the memory cells. For this example, each memory cell might be assigned one of sixteen data states, such as depicted and discussed with reference to FIG. 3, e.g., corresponding to a bit pattern of four bits. As such, there might be fifteen valley counts $969_1$-$969_{15}$ detected. Methods of locating such valley counts 969 are not the subject of the present application, but examples of such techniques can be found with reference to U.S. Pat. No. 9,361,996 issued Jun. 7, 2016 to Shen et al., and U.S. Patent Application Publication No. 2015/0098276 published Apr. 9, 2015 to Shen et al.

While valley detection techniques may rely on all data states being represented by the memory cells corresponding to the output of the page buffer provided to the N to $2^N$ decoder 1068, a sufficient sample size might generally be expected to contain such data. In addition, it is common to utilize data randomization techniques during programming of the memory cells, which may assure representation of each possible data state. Data randomization changes original data to encoded data, during a programming operation, such that it is stored in a pattern that is different than a pattern in which the original data would have been stored, and restores the encoded data to the original data during a read operation. In general, some function may be used to encode the original data, and the inverse of that function might be used to decode the encoded data to restore the original data. While generally referred to as a data randomizer in the art, it is recognized that the data is not truly randomized in a mathematical sense. Instead, randomization as used herein refers to a redistribution of data values in a reversible manner. Data randomization is often used to mitigate coupling effects between closely neighboring memory cells that can disturb the intended data states.

FIG. 10B depicts one example of using the detected valley counts 969 of FIG. 10A. A table 1080 may contain a number of rows 1082, with each row 1082 corresponding to a respective count. As one example, the table 1080 may be stored in the volatile memory 128 of FIG. 1. The rows 1082 of the table 1080 may be programmed in response to the valley counts 969. For example, the rows 1082 corresponding to counts less than, and for some embodiments, equal to, the valley count $969_1$ might be programmed to contain the bit pattern corresponding to the data state L0, or '1111' in this example. Rows 1082 corresponding to counts less than, and for some embodiments, equal to, the valley count $969_2$ and greater than, and for some embodiments, equal to, the valley count $969_1$ might be programmed to contain the bit pattern corresponding to the data state L1, or '0111' in this example. Rows 1082 corresponding to counts less than, and for some embodiments, equal to, the valley count $969_3$ and greater than, and for some embodiments, equal to, the valley count $969_2$ might be programmed to contain the bit pattern corresponding to the data state L2, or '0011' in this example, and so on. Rows 1082 corresponding to counts greater than, and for some embodiments, equal to, the valley count $969_{15}$ might be programmed to contain the bit pattern corresponding to the data state L15, or '1110' in this example.

Responsive to the outputs 1076', a particular row 1082 of the table 1080 corresponding to a count received on the outputs 1076' is selected for output on the output 1084. For example, if a count received on the outputs 1076' had a value between the valley count $969_4$ and the valley count $969_3$, the bit pattern '1011' might be provided to the output 1084. The data of a subset of the page buffer registers 756 could be utilized to select rows 1082 of the table 1080 for output, corresponding to a respective subset of a logical page of memory cells selected for the read operation. The subset selected for output might be mutually exclusive to the subset sampled in order to generate the valley counts 969. For example, the subset selected for output might include only those page buffer registers 756 not included in the sampled subset. Alternatively, the subset selected for output might include all page buffer registers 756 corresponding to the logical page of memory cells selected for the read operation, thus including the sampled subset.

FIG. 10C depicts another example of using the detected valley counts 969 of FIG. 10A. Each valley count 969 might be provided to a respective comparator 1086, e.g., comparators $1086_1$-$1086_{15}$, i.e., comparators C1-C15. Each comparator 1086 might be configured to compare the outputs 1076' to their respective valley count 969, outputting a first logic level, e.g., a logic 0 level, if the count on the outputs 1076' is less than, and for some embodiments, equal to, the respective valley count 969, and outputting a second logic level, e.g., a logic 1 level, if the count on the outputs 1076' is greater than, and for some embodiments, equal to, the respective valley count 969. The outputs of the comparators 1086 may thus collectively provide a thermometric scale encoding, e.g., a value represented by a number of bits where all bits having a logic 0 level are contiguous to each other, and all bits having a logic 1 level are contiguous to each other. The outputs of the comparators 1086 might be provided to a Thermometric Scale to Gray Code Decoder 1088. Gray coding provides that the respective bit pattern for each data state assignable to the memory cells differs from an adjacent data state by only one bit. This can facilitate a reduction in errors in that a memory cell whose threshold voltage shifts into a range corresponding to an adjacent data state would result in only one erroneous bit. For example, a memory cell intended to store the data state L3 having a bit pattern of '1011' but being read as having the data state L2 having a bit pattern of '0011' will only be erroneous in its most significant (e.g., left-most) bit. If that memory cell was instead read as having the data state L4 having a bit pattern of '1001' it would again have only one erroneous bit.

FIG. 11 depicts a thermometric scale to Gray code decoding for use with various embodiments. FIG. 11 provides an example of decoding a count received on the outputs 1076' to a representation of its corresponding data state in a manner such as described with reference to FIG. 10C. The data of a subset of the page buffer registers 756 could be utilized for input to the comparators 1086 and output of the decoder 1088, corresponding to a respective subset of a logical page of memory cells selected for the read operation. The subset selected for output might be mutually exclusive to the subset sampled in order to generate the valley counts 969. For example, the subset selected for output might include only those page buffer registers 756 not included in the sampled subset. Alternatively, the subset selected for output might include all page buffer registers 756 corresponding to the logical page of memory cells selected for the read operation, thus including the sampled subset.

Figure 12:
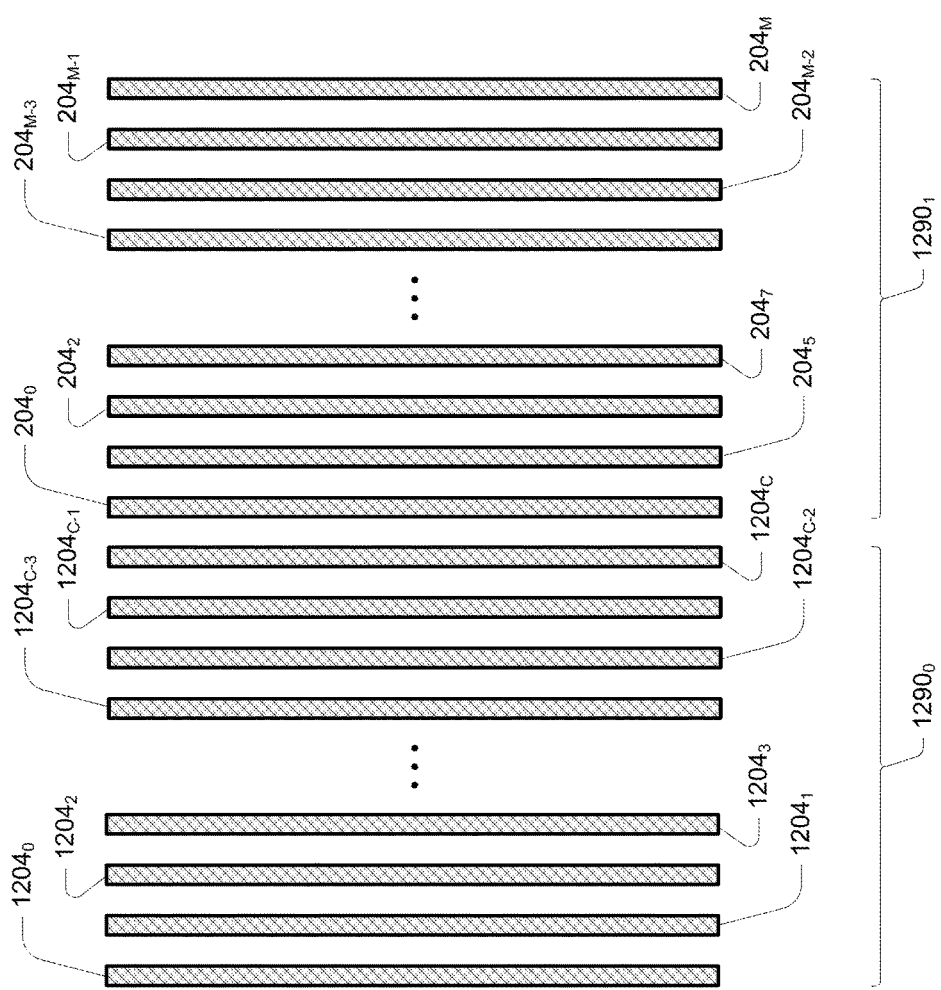
FIG. 12 is a block diagram of data lines in accordance with an embodiment.

FIG. 12 is a block diagram of data lines of an array of memory cells in accordance with an embodiment. Various embodiments might store a predetermined pattern of data to memory cells associated with a portion of the data lines connected to the data register. The predetermined pattern of data might represent each of the data states assignable to the memory cells. These memory cells might be expected to experience the same or similar levels of threshold voltage shift as the memory cells associated with the remaining portion of the data lines connected to the data register. For one embodiment, the array of memory cells might include a first portion $1290_0$ of data lines selectively connected to memory cells configured to store the predetermined pattern of data, which might be referred to as canary data lines, e.g., canary bit lines, $1204_0$-$1204_C$. The array of memory cells might further include a second portion $1290_1$ of data lines, e.g., bit lines, $204_0$-$204_M$, selectively connected to memory cells configured to store user data.

As one example, the first portion $1290_0$ of data lines might include 1024 canary data lines 1204, e.g., where C=1023. For embodiments connecting every other data line to sense circuitry during a read operation, the sample to be used for generating the valley counts 969 might then be the corresponding data of 512 canary data lines 1204. For the example of sixteen possible data states, 32 of these canary data lines 1204 might be configured to store the data state L0 in their corresponding memory cells, 32 might be configured to store the data state L1 in their corresponding memory cells, and so one. The use of canary data lines 1204 in this manner might aid determination of appropriate read voltages to utilize in the determination of the data states of the memory cells of a logical page of memory cells selected for a read operation. For example, the determination of the valley counts 969 might be simplified by knowing the expected data states of the sampled memory cells.

In addition, the data register might be configured to stream its data output, e.g., outputting the data (e.g., in parallel) of the data registers 864 of a first page buffer register 756, then outputting the data (e.g., in parallel) of the data registers 864 of a next page buffer register 756, and so on. If the data corresponding to the canary data lines 1204 are output first, their corresponding data can be utilized for generating the valley counts 969 for use in determining the data states of the data corresponding to the remaining data lines of the logical page of memory cells, e.g., those data lines of the data lines $204_0$-$204_M$ configured for storage of user data. As such, while the streaming of data from the data register might need to be paused to give sufficient time to generate the valley counts 969, subsequent streaming of the user data might then be uninterrupted.

Figure 13:
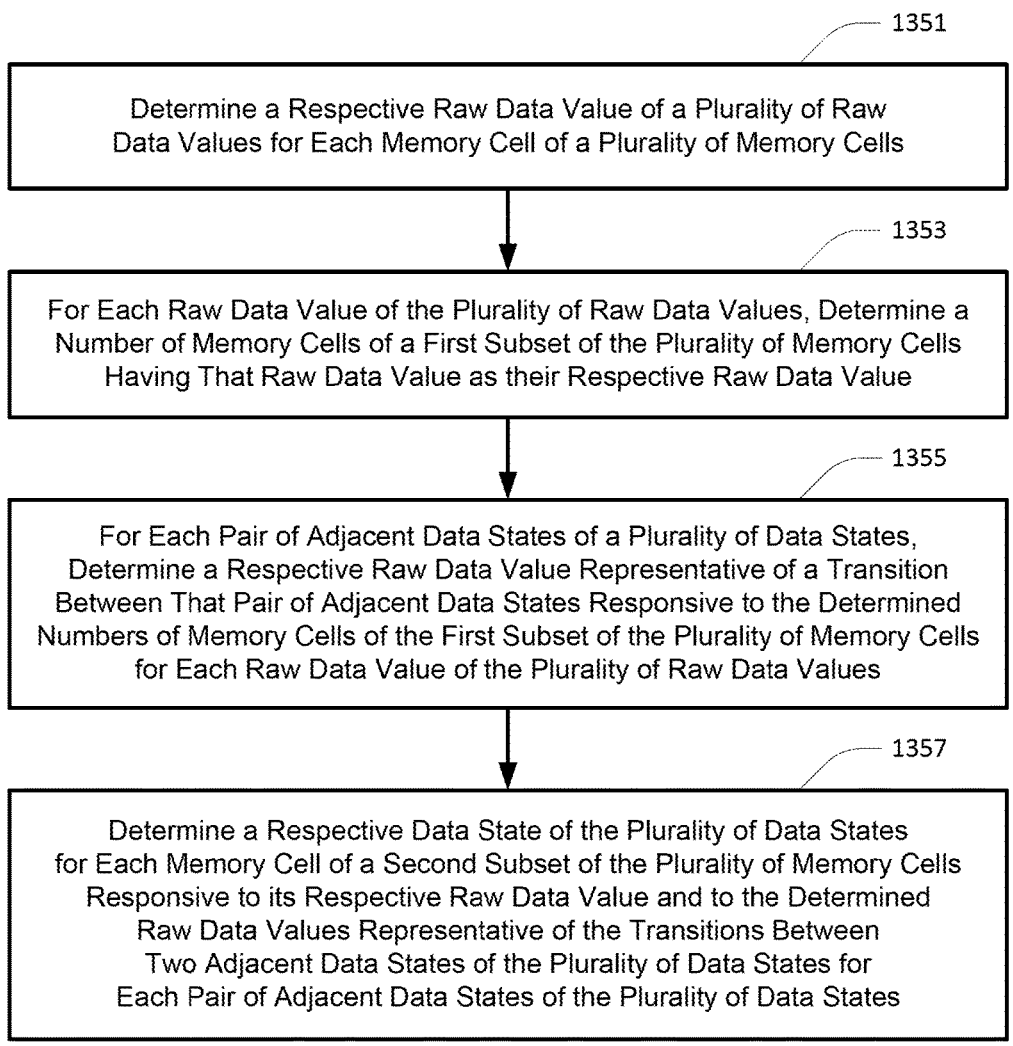
FIG. 13 is a flowchart of a method of operating a memory in accordance with an embodiment.

FIG. 13 is a flowchart of a method of operating a memory in accordance with an embodiment. At 1351, a respective raw data value of a plurality of raw data values for each memory cell of a plurality of memory cells is determined. The raw data value for a given memory cell may represent a count corresponding to a voltage level of a read voltage that activated that memory cell during a read operation. The plurality of memory cells might include a logical page of memory cells selected for the read operation.

At 1353, for each raw data value of the plurality of raw data values, a number of memory cells of a first subset of the plurality of memory cells having that raw data value as their respective raw data value is determined. The first subset of the plurality of memory cells might include a portion of the plurality of memory cells storing user data. Alternatively, the first subset of the plurality of memory cells might include a portion of the plurality of memory cells storing a predetermined pattern of data, e.g., a known pattern of data representing each data state assignable to the plurality of memory cells.

At 1355, for each pair of adjacent (e.g., immediately adjacent) data states of a plurality of data states, a respective raw data value representative of a transition between that pair of adjacent data states is determined responsive to the determined numbers of memory cells of the first subset of the plurality of memory cells for each raw data value of the plurality of raw data values. The plurality of data states might include each data state assignable to the plurality of memory cells. The raw data value representative of a transition between a pair of adjacent data states might be a raw data value that would occur at a valley between groupings of memory cells having raw data values for those two adjacent data states.

At 1357, a respective data state of the plurality of data states is determined for each memory cell of a second subset of the plurality of memory cells responsive to its respective raw data value and to the determined raw data values representative of the transitions between two adjacent data states of the plurality of data states for each pair of adjacent data states of the plurality of data states. For embodiments where the first subset of the plurality of memory cells might include a portion of the plurality of memory cells storing user data, the second subset of the plurality of memory cells might include all memory cells of the plurality of memory cells, thus including the first subset of the plurality of memory cells. Alternatively, for embodiments where the first subset of the plurality of memory cells might include a portion of the plurality of memory cells storing a predetermined pattern of data, e.g., a known pattern of data representing each data state assignable to the plurality of memory cells, the second subset of the plurality of memory cells might include a remaining (e.g., mutually exclusive) portion of the plurality of memory cells, and these memory cells might store user data.

Figure 14:
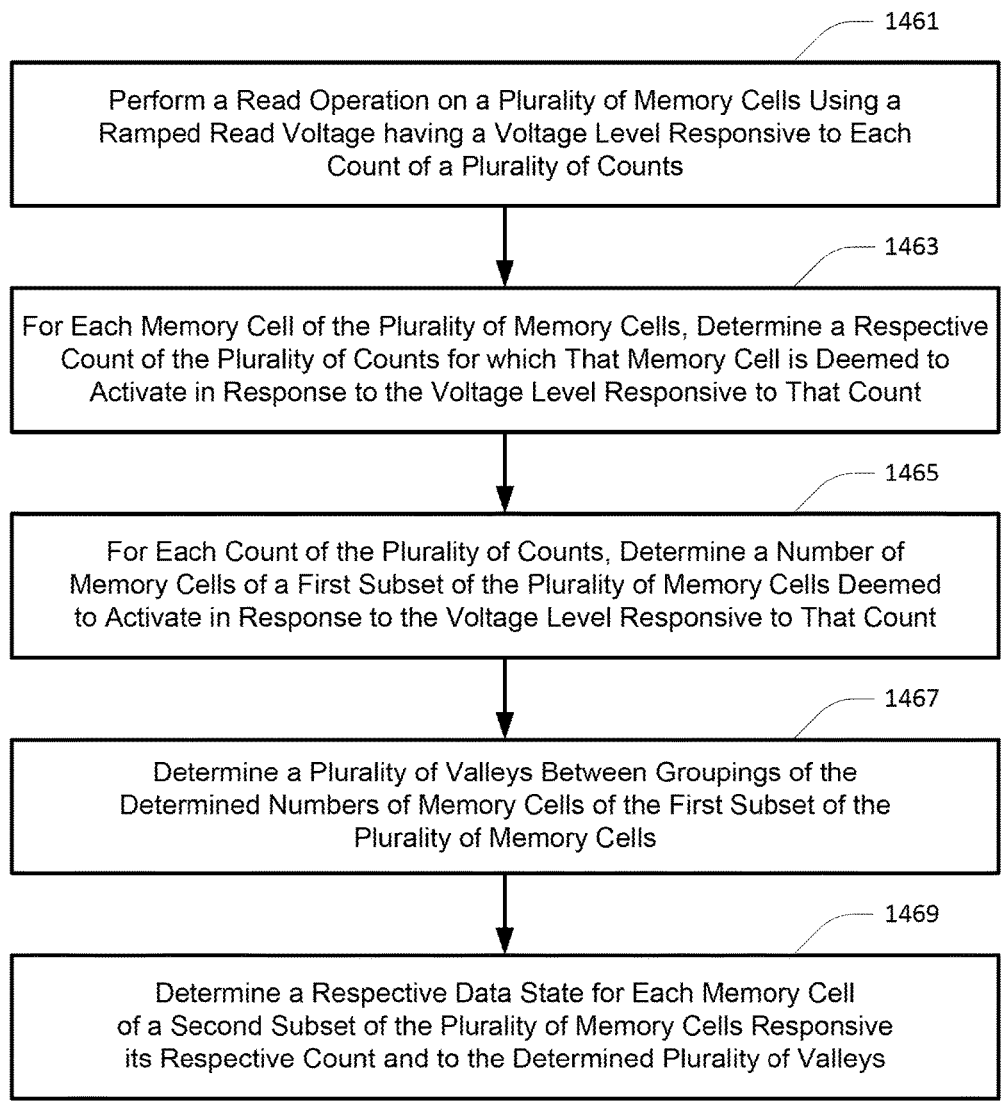
FIG. 14 is a flowchart of a method of operating a memory in accordance with another embodiment.

FIG. 14 is a flowchart of a method of operating a memory in accordance with another embodiment. At 1461, a read operation is performed on a plurality of memory cells using a ramped (e.g., increasing) read voltage having a voltage level responsive to each count of a plurality of counts, e.g., having a plurality of different voltage levels. The plurality of memory cells might include a logical page of memory cells selected for the read operation. Furthermore, each memory cell of the plurality of memory cells might be a memory cell of a respective string of series-connected memory cells, e.g., NAND strings.

As an example, the ramped read voltage could be applied to an access line (e.g., selected access lines) commonly coupled to (e.g., connected to control gates of) the logical page of memory cells, e.g., word line $202_x$ of FIG. 2A. While the ramped read voltage is being applied to the selected access line, voltage levels might be applied to remaining access lines for unselected memory cells, e.g., memory cells not selected for the read operation, that are sufficient to activate those memory cells regardless of their data states. For example, pass voltages might be applied to word lines $202_0$-$202_{x-1}$ and $202_{x+1}$-$202_N$ in this example.

At 1463, for each memory cell of the plurality of memory cells, a respective count of the plurality of counts for which that memory cell is deemed to activate in response to the voltage level responsive to that count is determined. A memory cell might be deemed to activate if a particular magnitude of voltage change, or a particular magnitude of current, on its corresponding data line is sensed (e.g., detected). The respective count might be deemed to be the count latched by the page buffer in response to an indication that the corresponding memory cell activated, e.g., the count present as input to the page buffer at the time the sense circuitry indicates activation of that memory cell. This may be deemed true even if the memory cell activated in response to a voltage level of the read voltage other than the voltage level corresponding to the latched count, e.g., due to lags in signal transitions.

At 1465, for each count of the plurality of counts, a number of memory cells of a first subset of the plurality of memory cells deemed to activate in response to the voltage level responsive to that count is determined. The first subset of the plurality of memory cells might include a portion of the plurality of memory cells storing user data. Alternatively, the first subset of the plurality of memory cells might include a portion of the plurality of memory cells storing a predetermined pattern of data, e.g., a known pattern of data representing each data state assignable to the plurality of memory cells.

At 1467, a plurality of valleys between groupings of the determined numbers of memory cells of the first subset of the plurality of memory cells is determined. And at 1469, a respective data state for each memory cell of a second subset of the plurality of memory cells is determined responsive its respective count and to the determined plurality of valleys. For embodiments where the first subset of the plurality of memory cells might include a portion of the plurality of memory cells storing user data, the second subset of the plurality of memory cells might include all memory cells of the plurality of memory cells, thus including the first subset of the plurality of memory cells. Alternatively, for embodiments where the first subset of the plurality of memory cells might include a portion of the plurality of memory cells storing a predetermined pattern of data, e.g., a known pattern of data representing each data state assignable to the plurality of memory cells, the second subset of the plurality of memory cells might include a remaining (e.g., mutually exclusive) portion of the plurality of memory cells, and these memory cells might store user data.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
producing a count having a plurality of count values;
for each count value of the plurality of count values, generating a respective voltage level of a plurality of voltage levels and applying that voltage level to control gates of a plurality of memory cells;
for each count value of the plurality of count values, determining a number of memory cells of a first subset of memory cells of the plurality of memory cells deemed to first activate while the count has that count value;
determining a plurality of distributions of the numbers of memory cells of the first subset of memory cells of the plurality of memory cells deemed to first activate for each count value of the plurality of count values, each distribution of the plurality of distributions corresponding to a respective data state of a plurality of data states;
for each adjacent pair of distributions of the plurality of distributions, determining a respective count value corresponding to a transition between that pair of distributions;
for each memory cell of a second subset of memory cells of the plurality of memory cells, mutually exclusive to the first subset of memory cells, assigning a respective data state of the plurality of data states to that memory cell responsive to a count value when that memory cell was deemed to first activate and the respective count values of the transitions for each adjacent pair of distributions.

2. The method of claim 1, further comprising:
programming a table in response to the determined respective count values corresponding to the transitions between the adjacent pairs of distributions of the plurality of distributions, wherein the table comprises a respective row for each count value of the plurality of count values, and wherein programming the table comprises programming a respective data state of the plurality of data states to each row of the table;

wherein the respective data states programmed to each row of the table corresponding to count values of the plurality of count values that are less than a first count value representative of the transition between a first data state of the plurality of data states and a second data state of the plurality of data states, and greater than a second count value representative of the transition between the second data state and a third data state of the plurality of data states, are a same particular data state;

wherein the second data state is immediately adjacent to the first data state;

wherein the third data state is immediately adjacent to the second data state; and wherein the second data state is between the first data state and the third data state.

3. The method of claim 2, wherein the respective data state programmed to the row of the table corresponding to the first count value is the particular data state.

4. The method of claim 2, wherein the respective data state programmed to the row of the table corresponding to the second raw data value is the particular data state.

5. The method of claim 2, wherein the particular data state is the second data state.

6. The method of claim 2, wherein assigning a respective data state of the plurality of data states to a memory cell of the second subset of memory cells responsive to the count value when that memory cell was deemed to first activate and the respective count values of the transitions for each adjacent pair of distributions comprises selecting a row of the table responsive to that count value.

7. The method of claim 1, further comprising programming the memory cells of the first subset of memory cells to contain a predetermined pattern of data.

8. The method of claim 1, wherein programming the memory cells of the first subset of memory cells to contain the predetermined pattern of data comprises programming each data state assignable to the plurality of memory cells to a respective mutually exclusive subset of the first subset of the plurality of memory cells.

9. A method of operating a memory, comprising:
generating a count having a plurality of increasing count values;
generating a plurality of increasing voltage levels in response to the plurality of increasing count values, wherein each voltage level of the plurality of increasing voltage levels corresponds to a respective count value of the plurality of increasing count values;
applying the plurality of increasing voltage levels to an access line coupled to control gates of a plurality of memory cells;
for each memory cell of the plurality of memory cells, determining a respective count value of the plurality of increasing count values at which that memory cell is deemed to first activate in response to applying the plurality of voltage levels to the access line;
determining a plurality of distributions from numbers of memory cells of a first subset of memory cells of the plurality of memory cells deemed to first activate for each count value of the plurality of increasing count values, each distribution of the plurality of distributions corresponding to a respective data state of a plurality of data states;
for each adjacent pair of distributions of the plurality of distributions, determining a respective count value of the plurality of increasing count values corresponding to a transition between that pair of distributions; and
for each memory cell of a second subset of memory cells of the plurality of memory cells, mutually exclusive to the first subset of memory cells, assigning a respective data state of the plurality of data states to that memory cell responsive to its determined respective count value and the respective count values of the transitions for each adjacent pair of distributions.

10. The method of claim 9, wherein generating the count having the plurality of increasing count values comprises generating the count having a number of count values greater than a number of data states of the plurality of data states.

11. The method of claim 10, further comprising:
assigning a particular data state of the plurality of data states to each memory cell of the second subset of memory cells having its determined respective count value greater than a first count value of the plurality of increasing count values and less than a second count value of the plurality of increasing count values;
wherein at least one count value of the plurality of increasing count values occurs between the first count value and the second count value.

12. The method of claim 11, further comprising:
assigning the particular data state of the plurality of data states to each memory cell of the second subset of memory cells having its determined respective count value equal to the second count value.

13. The method of claim 11, further comprising:
assigning the particular data state of the plurality of data states to each memory cell of the second subset of memory cells having its determined respective count value equal to the first count value.

* * * * *